(12) United States Patent
Velicu et al.

(10) Patent No.: US 7,821,807 B2
(45) Date of Patent: Oct. 26, 2010

(54) NONEQUILIBRIUM PHOTODETECTORS WITH SINGLE CARRIER SPECIES BARRIERS

(75) Inventors: Silviu Velicu, Darien, IL (US);
Christoph H. Grein, Wheaton, IL (US);
Sivalingam Sivananthan, Naperville, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 232 days.

(21) Appl. No.: 12/105,082

(22) Filed: Apr. 17, 2008

(65) Prior Publication Data
US 2009/0261442 A1 Oct. 22, 2009

(51) Int. Cl.
*G11C 11/36* (2006.01)
*H01L 31/0328* (2006.01)
*H01L 21/00* (2006.01)

(52) U.S. Cl. ............... 365/115; 365/109; 365/110; 365/112; 365/175; 257/15; 257/22; 257/97; 257/103; 257/184; 438/36; 438/47; 438/95; 438/191; 438/312

(58) Field of Classification Search ............... 365/109, 365/110, 112, 115; 257/2, 12, 15, 22, 96, 257/97, 103, 184, 188; 438/36, 47, 94, 95, 438/602
See application file for complete search history.

(56) References Cited

U.S. PATENT DOCUMENTS

| 4,972,245 A | 11/1990 | Yamaka et al. |
| 5,016,073 A | 5/1991 | Elliott et al. |
| 6,049,116 A | 4/2000 | Park et al. |
| 6,081,019 A | 6/2000 | White |
| 6,906,358 B2 | 6/2005 | Grein et al. |

OTHER PUBLICATIONS

Velicu et al., "HgCdTe/CdTe/Si infared photodetectors grown by MBE for near-room temperature operation", J. of Electron. Mater., vol. 30, No. 6, p. 711-716 (Jun. 2001).
Johnson et al., "Electronic and optical properties of III-V and II-VI semiconductor superlattices", Physical Review B, vol. 41, No. 6, p. 3655-3669 (Feb. 15, 1990).
Bratt et al., "Potential barriers in HgCdTe heterojunctions", J. Vac. Sci. Technol. A3 (1), p. 238-245 (Jan./Feb. 1985).
Hansen et al., "Energy gap versus alloy composition and temperature in Hg1-xCdxTea)", J. of Appl. Phys., vol. 53, No. 10, p. 7099-7101 (Oct. 1982).

*Primary Examiner*—Ly D Pham
(74) *Attorney, Agent, or Firm*—Momkus McCluskey, LLC; Jefferson Perkins

(57) ABSTRACT

A photosensitive diode has an active region defining a majority carrier of a first conductivity type and a minority carrier of a second conductivity type. An extraction region is disposed on a first side of the active region and extracts minority carriers from the active region. It also has majority carriers within the extraction region flowing toward the active region in a condition of reverse bias. An exclusion region is disposed on a second side of the active region and has minority carriers within the exclusion region flowing toward the active region. It receives majority carriers from the active region. At least one of the extraction and exclusion region provides a barrier for substantially reducing flow of one of the majority carriers or the minority carriers, whichever is flowing toward the active region, while permitting flow of the other minority carriers or majority carriers flowing out of the active region. The barrier substantially reduces flow of the carriers without relying on diffusion length of the one carriers in order to reduce the flow.

38 Claims, 7 Drawing Sheets

NONEQUILIBRIUM PHOTODETECTORS WITH SINGLE CARRIER SPECIES BARRIERS

BACKGROUND OF THE INVENTION

Known diodes such as photosensors or photodetectors have semiconductor layers for producing a detectable change in electric current, by exciting electrons across forbidden bands or band gaps in the electronic structure of the semiconductor material. The electrons are excited by photons received from light or electromagnetic waves from radiation intercepted by the photodetector.

Referring to FIG. 1, one type of photodiode is a High Operating Temperature (HOT) nonequilibrium photodiode such as that disclosed by U.S. Pat. No. 5,016,073 issued to Elliott et al. (the "073 patent"). The HOT photodiode 100 has a photosensitive region 102 that absorbs incoming radiation in the form of infrared photons traveling through the photodiode along a pathway shown by arrow 104. The energy from the photons excites the electrons in the photosensitive region 102 across the band gap of the semiconductor material, which reduces resistivity and increases current running through the photodiode, and in turn indicates radiation has been detected.

The photosensitive region or active region or zone 102 is either lightly n-type, or as in this case, lightly p-type doped by ion implantation or in-situ doping in a concentration that is close to the natural or thermally generated majority carrier concentration. With this concentration, extrinsic behavior can be established in the active region 102 when the system is under reverse bias such that the impurities (dopants) contribute more carriers than the number of carriers generated thermally across the energy gap. N-type dopants establish electronic levels that are closer to the conduction band than they would be in a nondoped condition. This leads to indirect generation from the electronic levels that require less energy for an electron to jump from the level to the conduction band than an electron in direct generation from the valence band.

The active or photosensitive region 102 should have the minimum possible number of majority carriers in order to improve the detector's signal-to-noise ratio. This is because radiative and Auger generation-recombination processes are responsible for noise, and are less probable with lower majority carrier concentrations.

The desired majority carrier concentrations are obtained by reducing both the amount of majority and minority carriers diffusing into the active region. A reduction of minority carriers in the space charge balance of the photosensitive region 102 results in a corresponding loss of natural majority carriers leaving a very small minority carrier concentration and a low natural majority carrier concentration that is less than the majority concentration provided by the dopant. This reduction is further ensured directly by reducing the amount of majority carriers that diffuse into the active region.

One way to minimize or suppress minority carrier concentrations is to cool the photodetector. This, however, involves complex, bulky and expensive equipment.

One alternative solution, as presented by the '073 patent, discloses a way to reduce the minority carrier concentration in the photosensitive region 102 on a HgCdTe (mercury cadmium telluride or MCT) photodiode 100 without the conventional cooling parameters. This is accomplished by placing the photosensitive region 102 between an extraction layer or region 106 and an exclusion layer or region 108. The overall effect of this structure is that minority carriers are removed at the extraction region or layer 106 and are not resupplied at the exclusion region or contact 108. The same is true for majority carriers that are flowing in the opposite direction. The majority carriers are ideally removed at the exclusion region 108 and are not resupplied by the extraction region 106.

The exclusion layer or region 108 is a bulk semiconductor layer that prevents minority carrier injection into the active region 102 while permitting majority carriers to flow from the active region 102 to the exclusion region. The exclusion region 108 has the same conductivity type as the photosensitive region 102, defining a "pp" or "nn" junction or boundary 114 between the chemically different regions that establish different sizes of energy band gaps. The exclusion region 108 can be degenerately doped to be of the same conductivity type as the photosensitive region; i.e., the exclusion region is $n^+$ or $p^+$ according to whether the photosensitive region is n or p type respectively. In the alternative, the exclusion region is a heterojunction structure provided by a different and wider band gap semiconductor material, than in the photosensitive/active region 102 but with like majority carrier types, forming an nn or pp structure.

Electric fields and large external voltage drops over the exclusion region's length can drive the minority carriers toward the pp or nn junction 114 and into the photosensitive region 102. These are avoided by heavily doping the exclusion region 108. When the electric fields in the exclusion region are reduced enough or eliminated, the minority carriers are transported by diffusion.

The length of the exclusion region 108 is at least three times the diffusion length of the relevant carrier. Thus, the exclusion region is three times the diffusion length of the minority carrier to minimize or prevent the "in-diffusion" of minority carriers from the biasing contact on the exclusion region side.

The '073 patent discloses that the exclusion layer thickness should be at least 150 μm for doping $[N_A-N_D]>1\times10^{17}$ cm$^{-3}$ to prevent diffusion into the active region. More recent and accurate calculations conclude that three minority carrier diffusion lengths sums to approximately 60 μm for $[N_A-N_D]=1\times10^{17}$ cm$^{-3}$ for p-type, bulk $Hg_{0.7}Cd_{0.3}Te$ at a temperature of 230° K. as presented in U.S. Pat. No. 6,906,358.

The extraction region 106, a bulk semi-conductor layer, typically has the opposite majority carrier or conductivity type compared with that of the photosensitive region 102 and forms a p-n junction 116 with the photosensitive region. When a reverse bias is applied, the extraction region 106 extracts minority carriers from the photosensitive region 102 by electrons diffusing to the extraction region from the photosensitive region due to its lower conduction band energy, producing the effect of a "weir" or sink. At the same time, majority carriers in the extraction region ("majority" being relative to the active region 102) are able to flow, also by diffusion, from the extraction region to the active region.

As with the exclusion region 108, the extraction region 106 is heavily doped which reduces the electric field and permits majority carriers to diffuse to, and then flow across, the p-n junction 116 and into the active region 102. Thus, the extraction region is also typically designed to be at least three times diffusion length of the majority carrier to minimize the number of majority carriers flowing to the active region from the extraction region 106.

Calculations similar with the one presented in U.S. Pat. No. 6,906,358 conclude that three minority carrier diffusion lengths sums to approximately 25 microns for $[N_D-N_A]=1\times10^{17}$ cm$^{-3}$ for an n-type bulk $Hg_{0.7}Cd_{0.3}Te$ at a temperature of 230° K.

Attempting to provide a 60-150 μm thick exclusion region or 25 μm thick extraction region is extremely difficult while using Molecular Beam Epitaxy (MBE) crystal growth processes, as are typically employed for producing photodetectors or photodiodes.

Molecular Beam Epitaxy (MBE) is a chemical vapor deposition method in which a crystal or layered structure is grown on a template (substrate) within a chamber. The substrate is brought to, and kept at, a predefined growth temperature by a heating element typically placed behind the substrate. This is to ensure that sufficient energy is transferred to the substrate's surface to achieve specific reactions.

The structure is grown by providing atomic and/or molecular fluxes obtained by thermal evaporation of the charge materials. The growth process occurs in an ultra-high vacuum environment to minimize the presence of foreign atoms. Polycrystalline and/or amorphous materials are loaded into crucibles and constitute the charges. The fluxes are adjusted by controlling the temperatures of the charge materials. In this way, the incoming atoms/molecules from the charges have to spend a certain residence time on the surface while traveling/diffusing around in order to find a geometrical position that minimizes the surface energy. Shutters between the charges or charge materials in the effusion cells and substrate are individually controllable. They permit/forbid the flow of molecular beams of the particular materials that are desired at a particular time.

Since MBE has a typical growth rate of $10^{-10}$ m per second or about 2.5 µm per hour (for growing a 60 µm thick HgCdTe bulk exclusion layer for instance), it requires a growth duration of 24 hours. This long amount of time requires a substantial expense in equipment, maintenance, raw material and labor per exclusion region. The same problem occurs with growing the extraction region. This expense per region could be reduced if a barrier could be provided for the exclusion region and/or extraction region that is strong enough to block the appropriate carrier species so that diffusion length becomes irrelevant and is eliminated as a parameter of the thickness of the exclusion and/or extraction region.

The MBE extended time period required for growing the relatively thick exclusion and extraction layers also causes defects in the growth or growing crystal itself. In the MBE process, solid source materials are evaporated by heating them in effusion cells in order to transport them onto the growing crystal. The process of evaporation changes the surface area, shape and roughness of the source material left behind in the effusion cell. This results in drifts or changes over time in the composition of the fluxes of the material leaving the effusion cell. The uncontrolled variation in material fluxes changes the ratios of the fluxes of the Hg to CdTe to Te sources used to make the crystal (or in other words a variation in the ratios of the flux of material from each effusion cell used). This will randomly vary the composition, and can result in, for example, the establishment of an undesired energy gap. This random variation in energy gap can lead to absorption of infrared radiation in the exclusion layer or the extraction layer. The varied composition can also create undesired barriers to carrier flow such that the exclusion layer blocks the flow of majority carriers and/or the extraction layer does not efficiently extract minority carriers. Finally, an uncontrolled varied composition can result in poor quality crystals with varying diffusion lengths resulting in unpredictable device performance.

Another problem that can occur in the MBE process of manufacturing thick semiconductor exclusion layers is that while the crystal is thickened, it absorbs more infrared radiation from the substrate heater resulting in a rise in temperature over time. The power to the substrate heater is ramped down in order to compensate for the rise in temperature. However, the ramping down of the power frequently cannot be perfectly matched to the temperature rise because conflicting temperature requirements exist that are associated with emissivity as the crystal grows and require temperature durations not related to the rise in temperature. These variations in growth temperature lead to random variations in material composition, and in turn, variations in crystal quality.

In another alternative, disclosed by U.S. Pat. No. 6,081,019 issued to White and fully incorporated herein, and which is illustrated in FIG. 2, a HOT photodiode 120 is provided with a buffer layer 128 between the exclusion layer 124 and the active layer 122, and a buffer layer 130 between the extraction layer 126 and active layer 122. The layers are disposed on a growth substrate 136 and are biased through contacts or electrodes 132, 134.

Each buffer layer 130, 128 acts as an additional exclusion and extraction layer according to the side (exclusion side or extraction side) of the active layer they are disposed on. The buffer layers 130, 128 have lower dopant concentrations than their corresponding extraction or exclusion layer, although the HgCdTe chemical composition of the layers is otherwise the same as the corresponding extraction or exclusion layer. The chemical composition of the active layer is different than that in the buffer layers so that the buffer layers provide a wider band gap than that in the active layer and with much lower (10 to 100 times) concentration of minority carriers. This results in two extraction interfaces 140 on either side of the extraction buffer layer 130 and two exclusion interfaces 138 on either side of the exclusion buffer layer 128. The buffer layers 128, 130 provide a low minority carrier concentration at low doping regions close to the junctions, preventing high thermal generation leading to leakage current.

While the buffer layers 128, 130 are actually "buffering" the dopants themselves (i.e. the dopant atoms) and provide for a relatively thicker exclusion region to counter some diffusion length, the composition of the buffer layers 128, 130 do not provide a stronger physical barrier to minority or majority carriers. In other words, the same general proportion of minority and majority carriers that would diffuse from the exclusion layer 124 and the extraction layer 126 respectively and into the active region 122 would also diffuse from the buffer layer 128 if they occupied the same position relative to the biasing contact.

Referring to FIG. 3, it is known that a potential barrier can be provided at a p-n heterojunction that only blocks one carrier species of one conductivity type that is flowing from a first region, across the junction and into a second region while permitting flow of the other carrier species of the other conductivity type in the opposite direction across the junction. However, the number of variables or factors involved and the difficulty of precisely measuring the relevant quantities necessary to form a potential barrier at a p-n junction that effectively blocks one carrier while permitting flow of the other carrier is very difficult. These factors include the energy band gaps, junction grading width (i.e. grading of the dopant or carrier concentration rather than the chemical composition of the semiconductor material), location of the p-n junction, doping concentrations and electron affinities. In "Potential barriers in HgCdTe Heterojunctions" by Bratt et al., J. Vac. Sci. Technol. A3(1), pp. 238-245 (January/February 1985), a computer model for HgCdTe heterojunctions is disclosed. With this computer model, it has been found that, for one example, a potential barrier in the conduction band will appear in a heterojunction between a P-type region with an acceptor doping concentration $N_a$ of $5\times10^{15}$ cm$^{-3}$ and bandgap $E_{gp}$ of 0.12 eV and an N-type region with donor doping concentration $N_d$ of $1\times10^{15}$ cm$^{-3}$ and bandgap $E_{gn}$ of 0.40 eV.

FIG. 3 shows this barrier at the PN interface for different uniform junction grading widths. Many other barriers can be established with the proper but complex computer modeling as known from the Bratt et al. article.

Thus, while it is desirable to provide a HOT photodiode with a "Bratt" potential barrier, it is even more desirable to be able to erect an efficient single species barrier without the need for such complex computer modeling and to provide barriers even stronger than an abrupt "Bratt" barrier provides.

SUMMARY OF THE INVENTION

According to one aspect of the present invention, strong single species carrier barriers are provided for the exclusion region and/or extraction regions of a photodiode so that diffusion length becomes irrelevant in the design of the exclusion and/or extraction regions of the photodiode.

Specifically, a photosensitive diode has an active region defining a majority carrier of a first conductivity type and a minority carrier of a second conductivity type. At least one extraction region is disposed on a first side of the active region and extracts minority carriers from the active region. It also has majority carriers within the extraction region flowing toward the active region in a condition of reverse bias.

At least one exclusion region is disposed on a second side of the active region and has minority carriers within the exclusion region flowing toward the active region. It also receives majority carriers from the active region in a condition of reverse bias.

At least one of the extraction or exclusion regions provides a barrier for substantially reducing flow of one of the majority carriers and the minority carriers that is flowing toward the active region while permitting flow of the other of the minority carriers or majority carriers flowing out of the active region. The barrier substantially reduces flow of the one carriers by relying on a mechanism other than a diffusion length of the one carriers in order to reduce the flow.

In one embodiment, either the valence band profile or conduction band profile of the barrier takes the form of a flat-top peak, but not both. This inhibits carriers of one conductivity type to flow in one direction, but does not retard the flow of carriers of the opposite conductivity type in the opposite direction.

In one aspect of the invention, the photodiode is formed from a compound semiconductor and the barrier is created by varying the stoichiometry of the semiconductor material and the doping along the length of the photodiode. The barrier can be either a graded junction in which the stoichiometry and doping are gradually changed as a function of length, or an abrupt junction.

A preferred embodiment forms the photodiode from Group II-VI semiconductor material, and even more particularly from $Hg_{1-x}Cd_xTe$. In this last particular embodiment, the concentration of Cd is varied along with a dopant concentration in order to create the desired conduction and valence energy band profiles.

Thus, it has been determined that thinner extraction regions and exclusion regions of a photodetector or photodiode can be easily and accurately produced without diminishing the performance characteristics of either region.

DETAILED DESCRIPTION OF THE PREFERRED EMBODIMENT

Figure 1:
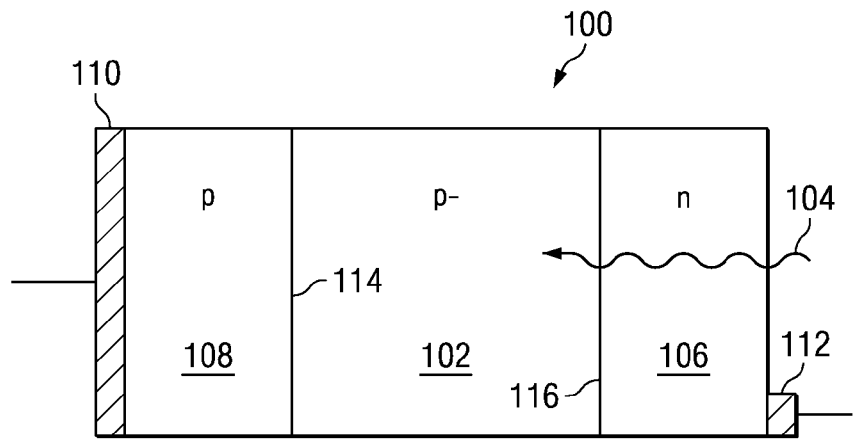
FIG. 1 is a simplified schematic drawing showing the layers of a known photodetector diode.
Figure 2:
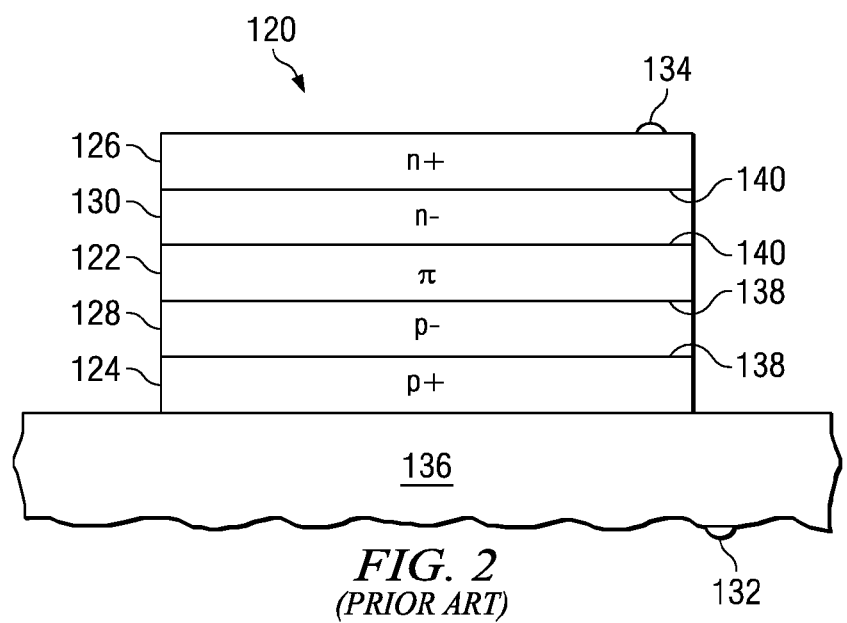
FIG. 2 is a simplified schematic drawing showing the layers of another known photodetector diode.
Figure 3:
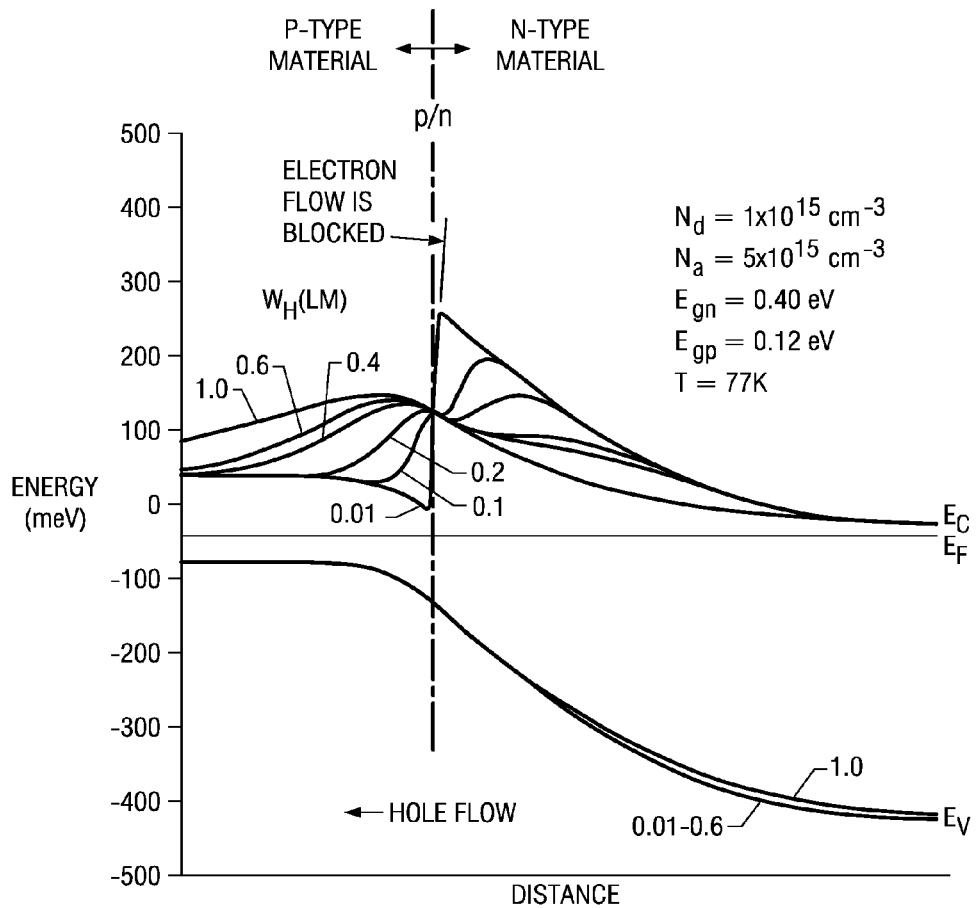
FIG. 3 is a graph of a known potential barrier on energy bands at a p-n junction.
Figure 4:
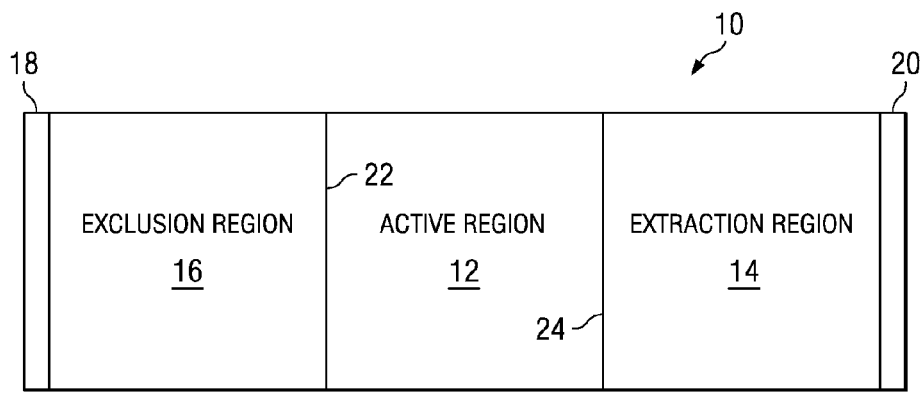
FIG. 4 is a simplified diagram of a photodetector of the present invention.

Referring to FIG. 4, a diode 10 has a number of epitaxial layers or regions including a photosensitive active region 12, an extraction region 14 formed on one side or face of the active region 12, and an exclusion region 16 on another side of the active region 12. While the extraction region 14 is shown on the opposite side of the exclusion region 16 for the preferred embodiment, it will be understood that they need not be opposite one another as long as they are properly placed in order along a current or bias path. In this case, two biasing contacts or electrodes 18, 20 coupled to the outer ends of the exclusion and extraction regions, respectively, provide a reverse bias through the diode and regions 12, 14 and 16 at approximately 1 volt. A junction 22 is defined at the interface of the exclusion region 16 and the active region 12, and a junction 24 is defined at the interface of the active region 12 and the extraction region 14.

The active region 12 should be lightly p-type or n-type doped. In a HgCdTe system, the dopant concentrations are preferably at about $1 \times 10^{15}$ cm$^{-3}$ but at most $5 \times 10^{16}$ cm$^{-3}$ with Au or As so that the active region behaves intrinsically at the operating temperature under no bias (unbiased condition). Here, intrinsic behavior refers to the situation where the number of carriers generated by any dopants or impurities does not exceed the number of thermally generated or "natural" carriers. Thus, in the intrinsic state and in thermal equilibrium, the density of holes and electrons are the same so that the rate of recombination equals the rate of thermal generation. Intrinsic behavior under zero bias ensures that once the diode 10 is under a reverse bias, it will release minority carriers for extraction from the active region as long as the doping is not too heavy. The active region 12 will then be out of thermal equilibrium and act extrinsically, providing most generation from the dopant majority carriers, providing an efficient, sensitive diode.

The extraction region 14 is heavily doped with a dopant having a conductivity type opposite from the conductivity type of the active region 12 such as (in a HgCdTe system) I or In in order to attract the minority carriers away from the active region under reverse bias and at the operating temperature. This forms extrinsic behavior at the extraction region 14 while under the unbiased condition at the operating temperature, which indicates that a low saturation current will be established under reverse bias that will extract the minority carriers across a p-n junction 15 formed at the junction of the active and extraction regions 12, 14.

The exclusion region 16 is preferably the same conductivity type as the active region 12 and forms a pp or nn boundary or heterojunction 22 with active region 12. When the active region 12 is lightly doped p-type, the exclusion region 16 is also doped p-type with Au or As although more heavily doped, the extraction region 14 is heavily doped n-type, and the minority carriers are electrons as defined by the active region. In the opposite conductivity configuration, when the active region 12 is lightly doped n-type, the exclusion region 16 is heavily doped n-type, the extraction region 14 is heavily doped p-type and the minority carriers are holes as defined by the active region.

In the illustrated embodiment, each of the regions 12, 14, and 16 are made of $Hg_{1-x}Cd_xTe$ (mercury cadmium telluride or MCT) bulk semiconductor material. For active region 12, x=0.265 for an operating temperature of 295° K. (to achieve an optical cut-off of wavelength $\lambda_c \approx 5.0$ µm), and x=0.19 for an operating temperature of 190° K ($\lambda_c \approx 110$ µm). For extraction region 14 and exclusion region 16, x=0.24 for an operating temperature of 295° K., and x=0.18 for an operating temperature of 190° K. These parameters will vary for other wavelength cut-offs.

It has been determined that with the proper compositions, amount of dopant and certain energy bandwidths in the extraction, active and exclusion regions of a HOT photodiode, it is possible to reliably establish barriers to a single species of carrier flow at the junctions so that the thickness of the extraction and exclusion region do not need to be based on the diffusion length of the carriers.

Figure 5:
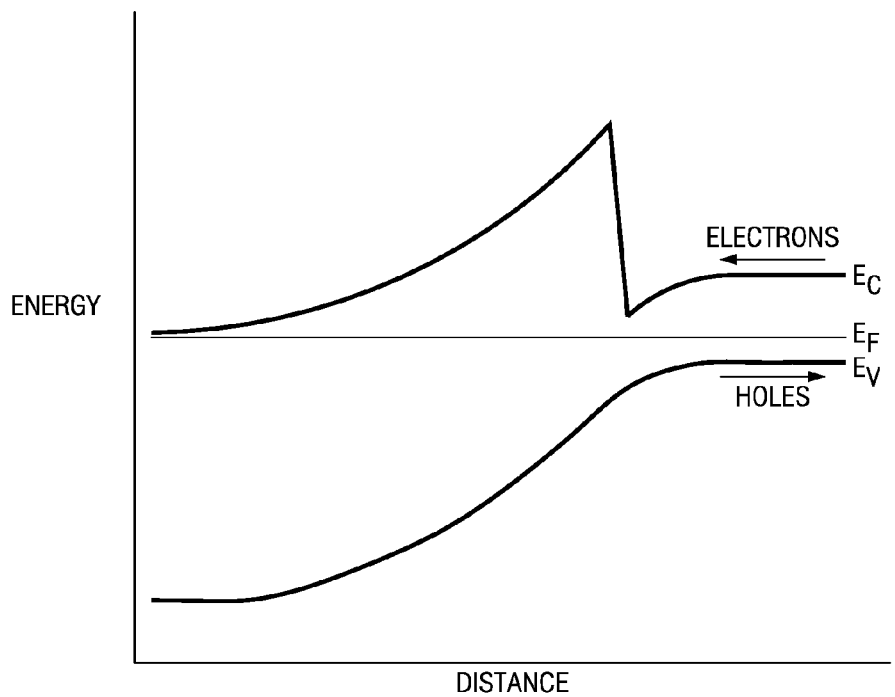
FIG. 5 is a graph of a potential barrier at a heterojunction on energy bands in the photodetector of FIG. 4 and according to the present invention.

Referring to FIGS. 4-5, in one aspect of the invention, a Bratt potential barrier is used on the HOT photodiode 10. In this case, the barrier is placed on the extraction region-active region junction 24, and the photodiode 10 is an n-n-p or n-v-p diode where the active region is n-type and the extraction region is p-type. The active region 12 is doped with donors at $N_d$=approximately $1 \times 10^{15}$ cm$^{-3}$ and has a band gap $E_{gn}$=0.40 eV. The extraction region 14 is doped with acceptors at approximately $N_a$=5×10$^{15}$ cm$^{-3}$ and has a band gap of $E_{gp}$=0.12 eV.

With this structure, as represented by the general representation of band gap profiles in FIG. 5, electrons (the majority carriers relative to the active region 12) are blocked by the potential barrier at junction 24 and cannot enter the active region from the extraction region 14. Simultaneously, the holes (minority carriers) are free to exit the active region 12 and enter the extraction region 14. This same type of "Bratt" abrupt barrier can be constructed at junction 22. It may also be a graded junction.

Figure 6:
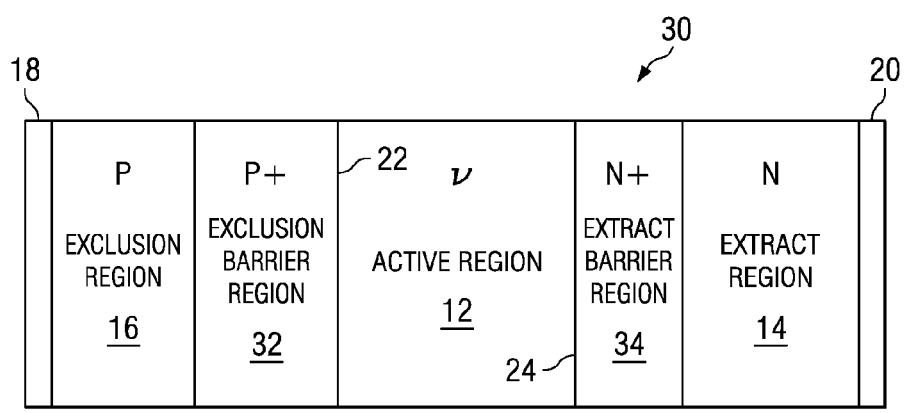
FIG. 6 is a simplified diagram of another photodetector of the present invention.

Referring to FIG. 6, in another aspect of the present invention, a photodiode 30 has some of the same structure as photodiode 10 from FIG. 4 and is numbered the same accordingly. Photodiode 30 also has an exclusion barrier region 32 and an extraction barrier region 34 on opposite sides of the active region 12 for providing strong barriers in a non-equilibrium photodiode. When the potential barriers are strong enough, diffusion length of the relevant carrier is no longer a factor. Here, barrier regions 32 and 34 prevent minority carriers from entering the active region 12 from the exclusion region 16 as well as prevent majority carriers from entering the active region 12 from the extraction region 14.

Figure 7:
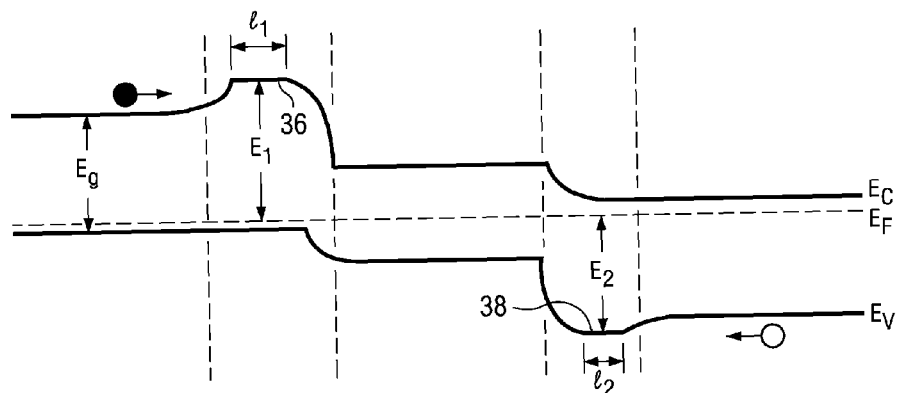
FIG. 7 is a graph of energy band profiles and gaps for the photodiode of FIG. 6 and according to the present invention.
Figure 8:
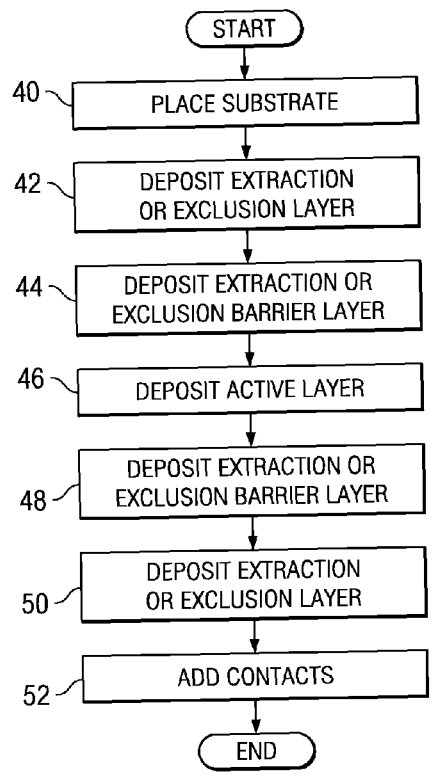
FIG. 8 is a flow chart for manufacturing the photodetector according to the present invention.

Referring to FIG. 7, each barrier region 32, 34 is provided with an increased energy band gap with a constant width $E_1$ or $E_2$ between the fermi level $E_F$ and the band profile so that a flat peak, pleateu or mesa 36, 38 are formed, providing a very wide barrier. The length $l_1$ or $l_2$ of the barrier makes it extremely efficient and difficult for the relevant carrier to jump over.

It will be understood that while FIGS. 6-7 show a P-P$^+$-v-N$^+$-N structure with a P-type exclusion and active region and an N-type extraction region 14, the graph of FIG. 7 can simply be flipped over or rotated horizontally to accurately show the general energy band profile of an N-N$^+$-v-P$^+$-P structure with an N-type exclusion and active region and a P-type extraction region.

The constant, wider band in the barrier regions 32, 34 is created by increasing the concentration of Cd in the $Hg_{1-x}Cd_xTe$ compared to the amount of Cd in the adjacent exclusion or extraction region 16, 14.

The increased Cd concentration, however, only controls the amount of widening of the band gap (or more accurately the change in the band gap width), and does not control in which direction (i.e. toward the valence band or conduction band) the band gap widens or moves to accommodate the widened gap.

In order to ensure that the potential barrier only blocks one desired species type and not the other, the barrier must only be constructed on the desired band (valence or conduction). For instance, on the N-type extraction side, the extraction barrier is only erected on the valence band so that only the majority carriers (holes) are blocked from entering the active region 12. The minority carriers (electrons) are still extracted from the active region and are not blocked by the widened energy gap at the barrier peak 38 as shown in FIG. 7. The opposite is true for the P-type side on the exclusion region in this case.

In order to control the vertical shift of the band gap, doping is increased in the barrier regions 32, 34, compared to the doping in the adjacent exclusion, extraction regions 16, 14 respectively. This shifts the widened gap toward the appropriate band (toward the valence band $E_v$ with N-type doping to block holes and toward the conduction band $E_c$ with P-type doping to block electrons). This also ensures that the Fermi level $E_F$ remains at the same constant and close distance from the opposite band profile where the barrier is not desired, making sure the carrier species for that band is allowed to cross the barrier region.

To determine the amount of Cd necessary to widen the band gap, the following equation is used:

$$E_g = -0.302 + 1.93 - 0.810x^2 + \\ 0.832x^3 + 5.35x10^{-4}(1-2x)\left(\frac{-1822 + T^3}{255.2 + T^2}\right) \text{(eV)} \quad \text{(a)}$$

where x is the mole count for the $Cd_xHg_{(1-x)}Te$ composition, $E_g$ is the energy band gap between $E_c$ and $E_v$ and T is the operating temperature. The equation is derived from Hansen, Schmit, Casselman, J. Appl. Phys, vol 53 (1982), 7099.

It has been determined that an effective constant barrier can be established when $E_g$ in the barrier region is 0.04 eV wider than in the adjacent exclusion/extraction region. In one example, it has been found that an increase to a band gap of $E_g$=0.172 eV in the barrier region 32 or 34 compared to a band gap width of $E_g$=0.122 eV for regions 14, 16 is effective. A Cd concentration of at least approximately x=0.32 for mid-infrared detection and at most approximately x=0.22 for long infrared detection for either barrier region 32, 34 can obtain these desired energy band gap widths.

To ensure that only one desired species is blocked, the P-type exclusion barrier region in this illustrated embodiment is doped with $N_a=1\times10^{18}$ cm$^{-3}$, while the N-type extraction barrier region 34 is doped with $N_d=1\times10^{18}$ cm$^{-3}$. The doping in the barrier region is preferably increased about one order of magnitude greater than the doping in the corresponding exclusion or extraction region 14, 16.

The band gap widths that create the barriers are preferably constant for at least a length of $l_1$ and $l_2$ along the band profile in order to form a very effective barrier that renders the diffusion length of carriers substantially irrelevant for blocking carriage entry into the entire region.

Thus, in one example, the following parameters are established for photodiode 30 (FIGS. 6-7):

| Region | X | Doping | $E_g$ | l |
|---|---|---|---|---|
| Excl. 16 | 0.2-0.22 | $1 \times 10^{17}$ cm$^{-3}$ | 0.12-0.16 eV | N.A. |
| Excl. Bar. 32 | 0.22-0.24 | $1 \times 10^{18}$ cm$^{-3}$ | $E_1$ = 0.04-0.06 eV $E_g$ = 0.16-0.19 eV | $l_1$ = 0.5-1.5 |
| Active 12 | 0.2 | $1 \times 10^{15}$ cm$^{-3}$ | 0.12 eV | N.A. |
| Extr. Bar. 34 | 0.22-0.24 | $1 \times 10^{18}$ cm$^{-3}$ | $E_2$ = 0.04-0.06 eV $E_g$ = 0.16-0.19 | $l_2$ = 0.5-1.5 |
| Extr. 14 | 0.2-0.22 | $1 \times 10^{17}$ cm$^{-3}$ | 0.12-0.16 eV | N.A. |

As shown in FIG. 7, the two barrier regions are labeled as P+ and N+ to represent the increased bandgap and increased doping.

Referring to FIGS. 6, 8 and 13A-13C, the photodiode 30 with the barrier regions 32, 34 can be grown by a number of crystal growth techniques, including as performed here, molecular beam epitaxy. For growing crystals of $Hg_{1-x}Cd_xTe$, a substrate (not shown) of $Cd_yZn_{1-x}Te$ or Si is used. These substrates are typically translucent, and are placed in the MBE growth chamber and heated as required (step 40).

Figure 13A:
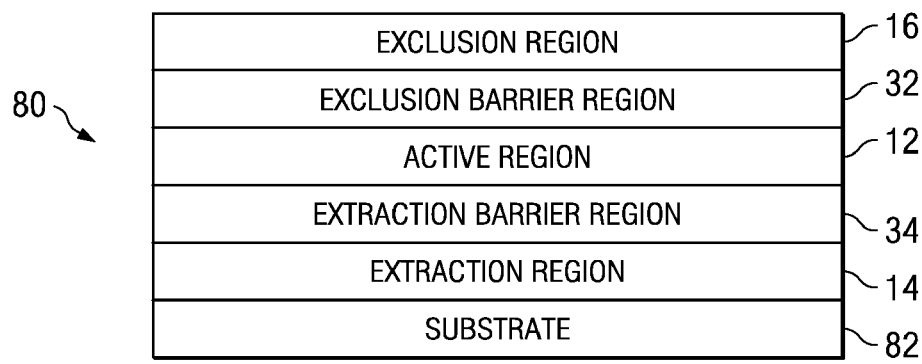
FIGS. 13A-13C are schematic diagrams for showing some of the steps in the construction of a photodiode according to the present invention.
Figure 13B:
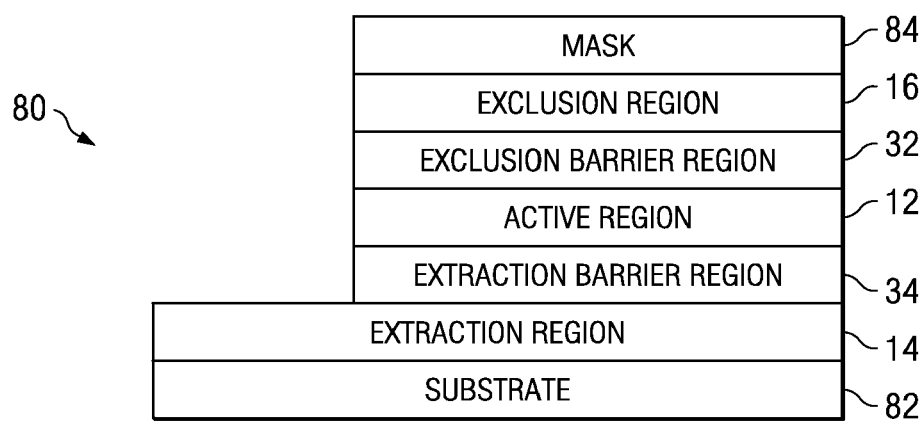
Figure 13C:
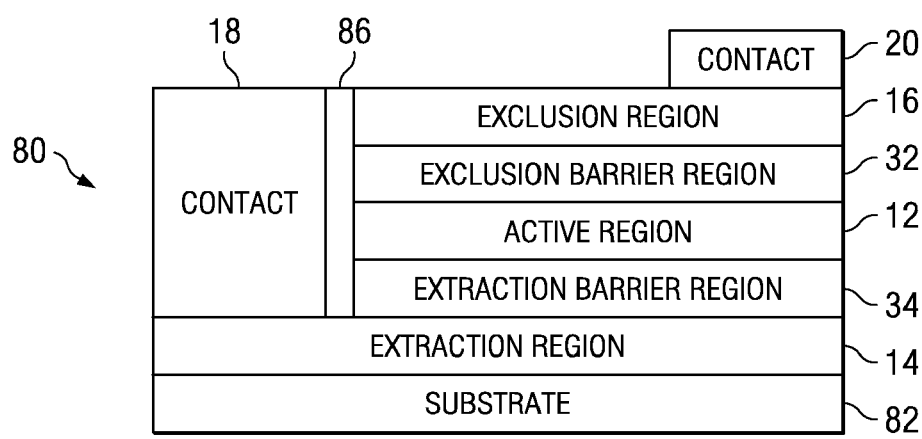

It does not matter which region (exclusion layer 16 or extraction layer 14) is grown as the first layer in the stack forming the diode 10 (step 42) on the substrate (82 shown in FIGS. 13A-C).

The barrier region 32 or 34 is grown or deposited next (step 44) with the increased Cd amounts specified above.

Next, the active region 12 is then deposited (step 46) and then the other barrier region (32 or 34) not yet formed is deposited (step 48). The corresponding exclusion/extraction region 14 or 16 is then grown.

During the process, the regions 12, 14 and 16, 32 and 34 are also doped either by post growth, or in-situ during growth, by known methods. This includes providing the increased doping of the barrier regions 32, 34.

Referring to FIGS. 13A-13C, after the MBE process, the six layer structure 80 including a substrate 82 (FIG. 13A) is taken out of the MBE chamber (not shown) for adding contacts 18 and 20 (step 52 for FIG. 8) to the diode.

To add the contacts, first, a mask 84 is applied to the top of the structure 80 so that a portion is exposed as shown in FIG. 13B. This portion is trench etched with chemicals known in the art. The mask 84 is then removed and, as shown in FIG. 13C, an insulation or passivation region or sidewall 86 is applied to the exposed sides of regions 12, 16, 32, 34. The contact metals 18, 20 are then deposited to complete the diode. The contact 18 in the etched area forms the contact on the extraction region side while the top contact 20 forms the exclusion region contact to complete the diode 30. It will be appreciated that many other forms for the diode will work sufficiently.

It will also be understood that while not nearly as advantageous, other processes such as LPE (Liquid Phase Epitaxy) or MOCVD (Metal-Organic Chemical Vapor Deposition) can be used instead of MBE in order to form the diode 30.

After these MBE layers are formed, and after later passivation and contact connection steps, arrays of those devices can be furnished with circuits for applying reverse bias and obtaining readout of signals produced by incident radiation. These diodes are connected to such circuitry by methods known in the art, as by metalization.

Figure 10:
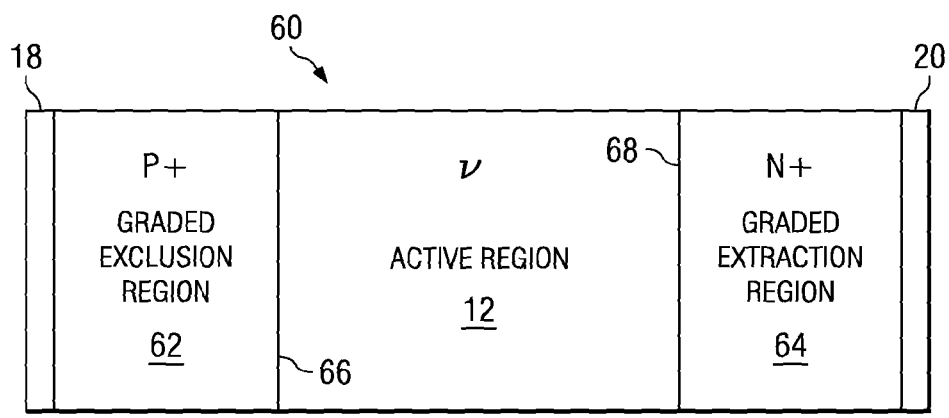
FIG. 10 is a simplified diagram of a photodetector with graded chemical compositions according to the present invention.

Referring to FIG. 10, a photodiode 60 has an exclusion region 62, an active region 12 and an extraction region 64. Contacts 18 and 20 are also provided respectively adjacent the exclusion and extraction region. Junctions or interfaces 66, 68 are formed on either side of the active region 12.

Figure 11:
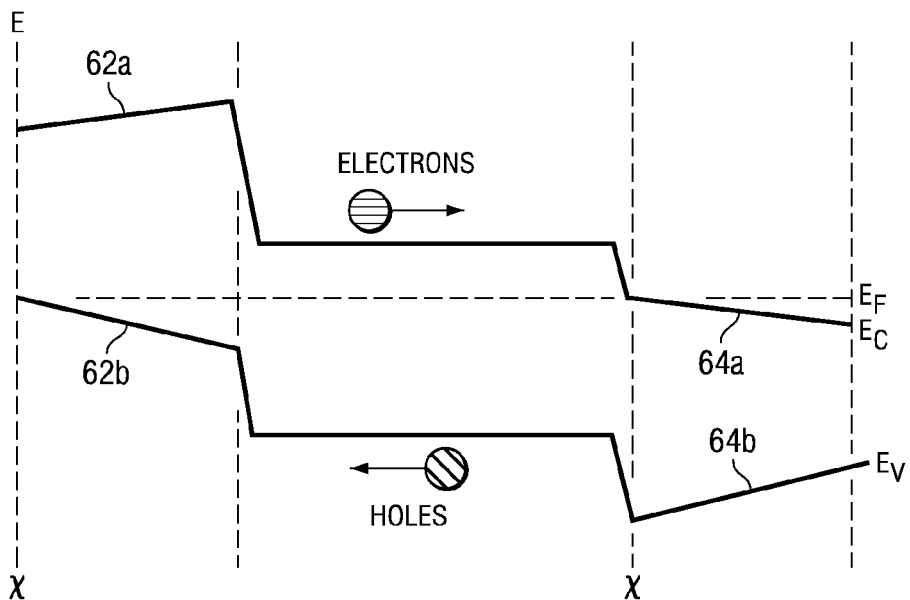
FIG. 11 is a graph of energy band profiles and gaps for the graded chemical composition photodetector of FIG. 10 according to the present invention.

In another aspect of the invention, instead of, or in addition to, providing flat, wide potential barrier peaks to form an efficient barrier at region interfaces/junctions to block a single carrier species as with photodiode 30, another impediment to single species carrier flow, rather than relying on diffusion length, can be formed along the length of the exclusion region 62 and/or the extraction region 64 of photodiode 60. This can be accomplished by providing a slant or grade along the energy bands $E_c$ and $E_v$ that results in a force being exerted on the carriers residing along each energy band. Using the behavioral characteristic of carriers that holes fall "up" to higher energy levels while electrons fall "down" to lower energy levels, when $E_c$ is slanted downward (relative to the direction of flow) the electrons are impacted by a force and accelerate down the "hill" analogous to gravity. Similarly, if $E_c$ is slanted upward, the electrons require more force to climb up the hill (i.e. a force analogous to gravity is exerted on the electrons) causing the electrons to slow or stop. The opposite is true with holes on the $E_v$ band. Holes fall and accelerate "up" but a force is exerted against the direction of movement of the holes when they are climbing "down." Thus, if the energy bands can be slanted in the appropriate directions in the exclusion and/or extraction regions (as shown by FIG. 11), one carrier species can be accelerated in one direction while the other carrier species flowing in the other direction can be blocked or substantially slowed.

Slanting the energy bands can be accomplished by continuously grading the chemical composition of the exclusion region 62 and/or extraction region since the composition of the region determines the position of the energy band as shown by equation (a) above. The grading is preferably provided for the entire length of the region (parallel to the direction of current flow through the diode 60) although grading the composition of only a part of the length of either or both exclusion and extraction regions is possible if desired.

Figure 9:
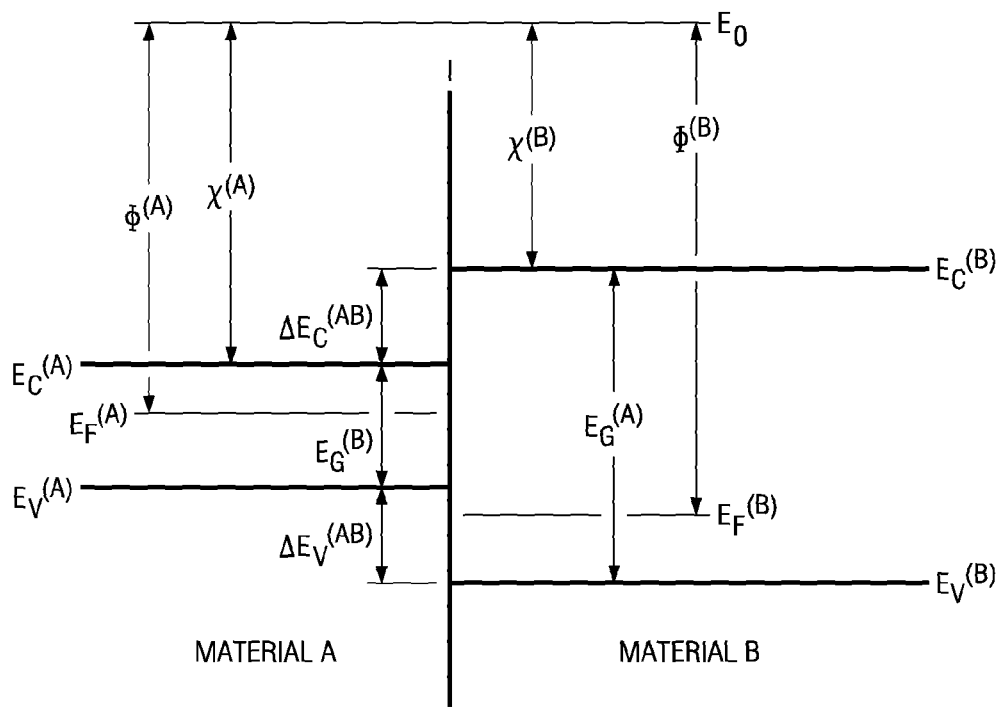
FIG. 9 is a schematic diagram of energy band profiles and gaps at a junction before thermal equilibrium for explaining the present invention.

Referring to FIG. 9, the grading and composition can be calculated by referring to the example energy band diagram for a semiconductor heterostructure interface before thermal equilibrium, where:

$E_0$=a reference vacuum energy level;
$E_c$=the conduction energy band;
$E_v$=the valence energy band;
$E_F$=the Fermi energy level;
$E_G$=the energy difference across the band gap (the width of the energy band gap);
$\Phi$=work measured as the difference between $E_0$ and the Fermi level $E_F$;
$\chi$=the energy needed to remove an electron located at $E_C$ from the semiconductor.

The superscripts (A) and (B) refer respectively to material A and material B on different sides of the interface I on FIG. 9, which may be of two different conductivity types (p-n junction) or of the same conductivity type but with two different dopant levels (p-p or n-n junction). In this example, material A is heavily doped and could represent an exclusion region or an extraction region with a narrow band gap. Material B is lightly doped and represents an active region.

When placed in contact, electrons want to move from the semiconductor with the higher Fermi level side (A side) to the lower Fermi level side (B side) while holes want to move in the opposite direction, and an electric field is produced to balance the transfer. The built-in potential is the difference between the work functions $\Phi$ of the isolated, bulk semiconductors. As a result of the redistribution of carriers and of the built-in electrical potential, the band diagram for a double heterostructure changes. Whether or not material 'A' is p-type or n-type, the carrier flowing out of the material A region and toward the (active v) material B region encounters an abrupt barrier at the interface I and cannot be injected into the active v region. The carrier flowing from Material B to Material A can cross the interface I.

With these rules in mind, the position of $E_C$ and $E_V$ can be determined by the chemical bonding of the atoms and can be measured or calculated by solving Schrödinger's equations:

$$E_C = E_0 - \chi, \text{ and} \qquad (b)$$

$$E_V = E_C - E_G \qquad (c)$$

Thus, substituting for $E_c$, we obtain $E_v = E_0 - \chi - E_G$ (d)

The energy band diagram in FIG. 9 ignores electrostatic potential due to rearrangement of mobile carriers which occur near the resulting junction after the semiconductors are placed in contact.

Referring to FIG. 11, if the composition of the exclusion or extraction region varies slowly over its length, the energy band structure at any point can be used to represent the band structure of the corresponding bulk semiconductor with the composition at that point. Because the composition is nonuniform, $E_C$ and $E_V$ (and also $\chi$ and $E_G$) will also be nonuniform. Using equations (b) and (d) as a basis and factoring in the change in potential, the resulting equations are:

$$E_C(x) = E_0 - \chi(x) - qV(x) \qquad (e)$$

$$E_V(x) = E_0 - \chi(x) - E_G(x) - qV(x) \qquad (f)$$

where here x is the position along the energy band as shown on FIG. 11, and where q is electron charge and V is the electrostatic potential.

The slanting sections of the energy bands are due to these electric field and compositional variations. Both energy bands Ec and Ev are slanted, although in opposite directions (i.e. up and down) relative to the direction of flow, causing a force to impact on the carrier/carrier type on that band. The amount of force on the electron or hole carrier due to the slant of the corresponding energy band is determined by calculating the slope of the conduction and valence band.

For an electron in the conduction band in an n$^+$ layer:

$$F_e = -dE_c/dx = qdV/dx + d\chi(x)/dx \qquad (g)$$

For a hole in the valence band of the n+ layer:

$$F_h = dE_v/dx = qdV/dx - d(\chi + E_G)/dx \qquad (h)$$

Due to these forces the injection of carriers into the absorber v layer is reduced or substantially eliminated. Thus, if it is known what force and slope of the energy bands is desired, the changing heights or vertical position of the energy bands $E_v$ and $E_c$ can be calculated for any position x along those energy bands. Once the desired, slanted vertical position of the energy band is determined, the required composition amount for any location x can be calculated.

Referring to FIGS. 10-11, in one example, photodiode 60 is a p-v-n or p-p-n structure where the minority carriers relative to the active region are electrons and the majority carriers are holes. The active region 12 and the contacts 18, 20 are the same material as that used in photodiode 30 or 10. In one example, the exclusion region 62 has a graded composition for $Hg_{(1-x)}Cd_xTe$ ranging from x=0.22 at the contact 18 end to x=0.25 on the active region 12 end. The extraction region 64 has a graded composition for $Cd_xHg_{(1-x)}Te$ ranging from x=0.22 at the contact 20 end to x=0.25 at the active region 12 end. The doping is still preferably generally constant at $1 \times 10^{17}$ cm$^{-3}$ for the exclusion and extraction regions.

In the exclusion region 62, this composition establishes an uphill slant section 62a on $E_c$ that significantly reduces the flow of electrons toward the active region 12 such that diffusion length can be ignored for limiting the amount of minority carriers entering the active region while still providing a very effective device. A "downhill" slant section 62b on the $E_v$ energy band permits, and even accelerates, the majority carrier (holes) flowing out of active region 12 and into the exclusion region 62.

In the extraction region 64, an "uphill" slant section 64b on the $E_v$ energy band reduces or substantially stops the flow of majority carriers (holes) into the active region 12 while a downhill slant section 64a on the $E_c$ energy band accelerates the flow of minority carriers (electrons) out of the active region 12 and into the extraction region 64.

It will be appreciated that while grading the entire length of the exclusion region 62 and/or extraction begins 64 at a constant rate is disclosed, it is also contemplated that controlled graded composition may only be disposed at part of one or both regions or the grading may not be linear and in fact change or stop on certain parts of the region.

In the preferred embodiment, the graded composition alone, without the establishment of additional barriers at the junctions 66, 68, provides an efficient photodiode while still eliminating the need to design for diffusion length to reduce carrier flow into the active region 12. However, it will be appreciated that an even more effective photodiode can be established by combining the graded composition of photodiode 60 with the abrupt potential barrier of photodiode 10 or the flat peak potential barrier of photodiode 30.

While in this embodiment diffusion is no longer a factor in providing the length of thickness of the exclusion and extraction regions, for HdCdTe systems these regions for photodiode 60 are preferably at least 0.3 µm long in order to avoid formation of potential barriers at the interfaces with the contacts 18, 20. Otherwise, the exclusion and extraction regions may provide efficient barriers for photodiode 60 at the minimum thickness possible to manufacture with the known etching and deposition techniques. This is also true for photodiodes 10, 30 and 70 below.

While the illustrated photodiode 60 is provided as p-v-n or p-p-n, it will be appreciated that the grading will work with regions of the opposite conductivity type (n-v-p or n-n-p).

Figure 12:
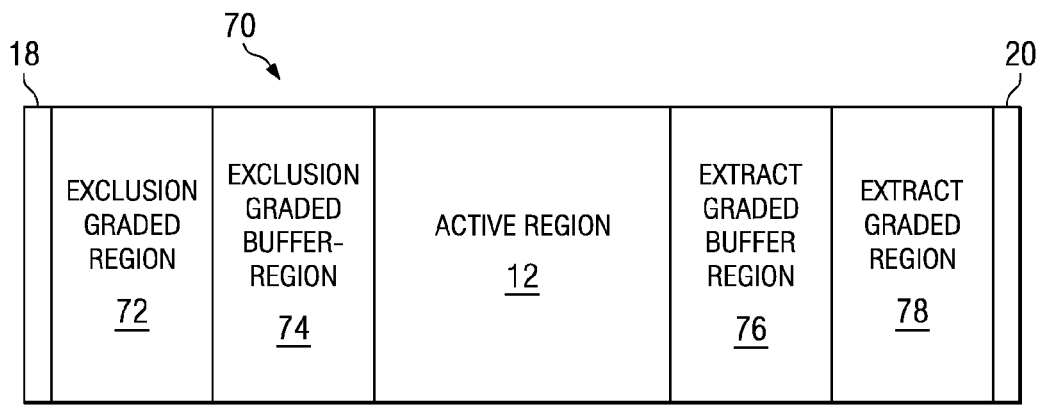
FIG. 12 is a simplified diagram of another graded chemical composition photodetector of the present invention.

Referring to FIG. 12, a photodiode 70 is similar to photodiode 60 except that it also includes buffer regions to block dopant flow into the active region 12. Here, a photodiode indicated generally at 70 has an active region 12, an exclusion region 72, and an extraction region 78. It also has an exclusion graded buffer region 74 placed in between the active region 12 and the exclusion region 72, and it has an extraction graded buffer region 76 placed in between the active region 12 and the extraction region 78.

For the illustrated embodiment, the active region 12 is $Hg_{1-x}Cd_xTe$ where x=0.18 and is preferably lightly p-type doped with $1\times10^{15}$ cm$^{-3}$ of As but is no greater than $5\times10^{16}$ cm$^{-3}$. It is also preferably about 4.0:m thick. The extraction region 78 is $Hg_xCd_{1-x}Te$ where it is graded as in extraction region 64 and is heavily n-type doped with $3\times10^{17}$ cm$^{-3}$ of I. It is at least less than 3.5:m thick and preferably less than three times the diffusion length of the carrier that is being blocked (i.e. the majority carrier in the extraction region 78). The exclusion region 72 is the same composition and dimensions as the exclusion region 62 (i.e., stoichiometry, dopant concentrations) except that in the exclusion region 72 the preferred length is less than three times the diffusion length of the minority carrier.

The extraction graded buffer region 76 is made of the same composition as the extraction region 78 except with less dopant ($1\times10^{15}$ cm$^{-3}$ of I) resulting in a wider band gap than in the active region 12.

The exclusion graded buffer region 74 is made with the same composition as the exclusion region 72 except that it is doped with about $1\times10^{15}$ cm$^{-3}$ of As. This results in a wider band gap in the exclusion graded buffer region 76 than in the active region 12.

The grading of all four regions 72, 74, 76 and 78 provides a very effective photodiode that eliminates the need to design for diffusion length to reduce carrier flow into active region 12. While all the exclusion and extraction regions are graded, it will be appreciated that the present invention covers the case where at least any one of those regions is graded as well as any pair (on one side or split on both sides of the active region) or even if three regions are graded. This also refers to grading any one of the exclusion, extraction and barrier regions in photodiodes 10 and 30.

Referring again to FIG. 8, the photodiodes 60 and 70 are manufactured with a process similar to that explained for photodiode 30 except for the deposition of extra buffer regions 74, 76 for photodiode 70 and that at least one of steps 42, 44, 48 and 50 may include the step of varying the flux of material into the MBE chamber in order to provide the varying composition to provided the grading.

The advantages of the present invention are now apparent. A HOT photodiode 10 has an abrupt or graded potential barrier at an interface between active region 12 and exclusion region 14 or active region 12 and extraction region 16. A photodiode 30 has flat peaks along the energy bands in barrier regions adjacent the active 12 for providing effective potential barriers to carrier flow into the active region 12. Photodiodes 60 and 70 provide exclusion and extraction regions 66, 68 or 74, 76 with graded compositions in order to block carrier flow into the active region 12. These structures provide efficient photodiodes while eliminating the need to design for diffusion length of extraction and exclusion regions to reduce or block the flow of a single carrier species into the active region 12.

While various embodiments of the present invention have been described, it should be understood that other modifications and alternatives can be made without departing from the spirit and scope of the invention, which should be determined from the appended claims.

What is claimed is:

1. A photosensitive diode, comprising:
   an active region defining a majority carrier of a first conductivity type and a minority carrier of a second conductivity type opposite the first conductivity type;
   at least one extraction region disposed on a first side of said active region, said extraction region extracting said minority carriers from said active region and having majority carriers within said extraction region flowing toward said active region in a condition of reverse bias;
   at least one exclusion region disposed on a second side of said active region, said exclusion region inhibiting said minority carriers within said exclusion region from flowing toward said active region and receiving said majority carriers from said active region in a condition of reverse bias,
   at least one of said extraction and said exclusion regions including a barrier for substantially reducing flow of one of said majority carriers and said minority carriers that is flowing toward said active region while permitting flow of the other of said minority carriers and said majority carriers out of said active region, said barrier substantially reducing flow of said one of said carriers without relying on diffusion length of said one of said carriers in order to reduce said flow, and
   at least two biasing contacts for applying said reverse bias through said photosensitive diode, one said contact being coupled to said exclusion region and the other said contact being coupled to said extraction region.

2. The diode of claim 1, wherein said one of said exclusion region and said extraction region having said barrier has a generally defined total length in a direction generally parallel to a current path produced by said reverse bias that is less than three times the diffusion length of said carriers flowing toward said active region within said one exclusion or extraction region.

3. The diode of claim 1, wherein said active region has an interface with said extraction region and an interface with said exclusion region, and wherein said barrier is a potential barrier disposed in the vicinity of one of said interfaces, said barrier forming one from the group consisting of an abrupt junction barrier and a graded junction barrier.

4. The diode of claim 1, wherein said active region has a junction with each of said extraction region and said exclusion region, and wherein said barrier is a potential barrier disposed in the vicinity of one of said junctions, the energy bands of said barrier forming a generally flat-topped peak when taken along a dimension orthogonal to said one junction.

5. The diode of claim 4, wherein the exclusion, active, and extraction regions of the diode are formed of a compound semiconductor including mercury, cadmium and tellurium, a length of said flat-topped peak being defined along said dimension being at least 0.5 µm long.

6. The diode of claim 4, wherein the exclusion, active, and extraction regions of the diode are formed of a compound semiconductor including mercury, cadmium and tellurium, an energy gap $E_g$ between a conduction band $E_c$ and a valence band $E_v$ at said peak being at least 0.04 eV larger than the energy gap generally defined by the region in which the barrier is disposed.

7. The diode of claim 4, wherein the diode is formed of a compound semiconductor having at least first and second constituents, variation of the concentrations of the first and second constituents causing the bandgap in the resulting semiconductor material to vary, the barrier being an exclusion barrier region disposed between the active region and a remainder of the exclusion region, the exclusion barrier region having a larger concentration of dopant and a larger concentration of the first constituent than the remainder of the exclusion region.

8. The diode of claim 7, wherein the compound semiconductor is $Hg_{(1-x)}Cd_xTe$, $0.18<x<0.4$.

9. The diode of claim 4, wherein the diode is formed of a compound semiconductor having at least first and second constituents, variation of the concentrations of the first and second constituents causing the bandgap in the resulting semiconductor material to vary, the barrier being an extraction barrier region disposed between the active region and a remainder of the extraction region, the extraction barrier region having a larger concentration of dopant and a larger concentration of the first constituent than the other extraction region.

10. The diode of claim 9, wherein the compound semiconductor is $Hg_{(1-x)}Cd_xTe$, $0.18<x<0.4$.

11. The diode of claim 4, wherein the diode is formed of a compound semiconductor having at least first and second constituents, variation of the concentrations of the first and second constituents causing the bandgap in the resulting semiconductor material to vary, the barrier comprising an exclusion barrier region disposed between the active region and another exclusion region, the exclusion barrier region having a larger concentration of dopant and a larger concentration of the first constituent than a remainder of the exclusion region, the diode further comprising an extraction barrier region disposed between the active region and a remainder of the extraction region, the extraction barrier region having a larger concentration of dopant and a larger concentration of the first constituent than the remainder of the extraction region.

12. The diode of claim 11, wherein the compound semiconductor is $Hg_{(1-x)}Cd_xTe$, $0.18<x<0.4$.

13. The diode of claim 1, wherein the diode is formed of a compound semiconductor and has a length generally parallel to a direction of current flow through said diode, wherein said exclusion region and said extraction region each define a total length generally parallel to said direction of flow, and wherein said barrier is formed by grading a chemical composition of at least one of said extraction and said exclusion regions along said length.

14. The diode of claim 13, wherein said grading is provided along the entire length of said one region.

15. The diode of claim 13, wherein said grading is provided along only a part of said length of said one region.

16. The diode of claim 13, wherein substantially all of said extraction and exclusion regions are graded along their said lengths.

17. The diode of claim 13, wherein the compound semiconductor is $Cd_xHg_{(1-x)}Te$, $0.18<x<0.4$, and said grading is accomplished by varying x along said length.

18. The diode of claim 17, wherein at least one of said exclusion region and said extraction region has a junction with the active region and a contact opposed to the junction, x increasing from the contact to the junction.

19. The diode of claim 17, wherein x is provided approximately in a range of 0.22 to 0.25 from one end of the length of said graded region to an opposite end.

20. The diode of claim 1, wherein said exclusion and extraction regions are made of a Group II-VI semiconductor.

21. A photosensitive diode, comprising:
an active region defining a majority carrier of a first conductivity type and a minority carrier of a second conductivity type opposite the first conductivity type;
at least one extraction region disposed on a first side of said active region, said extraction region extracting minority carriers from said active region and having majority carriers within said extraction region flowing toward said active region in a condition of reverse bias;
at least one exclusion region disposed on a second side of said active region, said exclusion region inhibiting the flow of said minority carriers within said exclusion region toward said active region and receiving said majority carriers from said active region in a condition of reverse bias,
barrier means for substantially reducing flow of one of said majority carriers and said minority carriers that is flowing toward said active region while permitting flow of the other of said minority carriers and said majority carriers out of said active region, said barrier means inhibiting said flow toward said active region without relying on a diffusion length of said one carriers flowing toward said active region, said barrier means being disposed in at least a predetermined one of said extraction region and said exclusion region, and
at least two biasing contacts for applying said reverse bias through said photosensitive diode, one said contact being coupled to said exclusion region and the other said contact being coupled to said extraction region.

22. The diode of claim 21, wherein said barrier means includes one selected from the group consisting of an abrupt junction barrier and a graded junction barrier in a vicinity of one of said sides of said active region.

23. The diode of claim 21, wherein one of a profile of the conduction energy band and a profile of the valence energy band taken through the barrier means forms a flat-top peak barrier.

24. The diode of claim 21, wherein said diode is formed of a compound semiconductor, said barrier means including a graded chemical composition of said predetermined one of said extraction and exclusion regions, the composition being graded along a length of the last said region generally parallel with a direction of current running through said diode.

25. The diode of claim 21, wherein a total length of said predetermined one of said extraction and exclusion regions is less than three times a diffusion length of said carriers flowing toward said active region within the predetermined one of said regions.

26. A photodiode comprising multiple epitaxial regions of semiconducting material and having an operating temperature, comprising:
a first semiconductor region having a first conductivity type, and doped to produce extrinsic behavior at the operating temperature in an unbiased condition;
a second semiconductor region of a second conductivity type opposite the first conductivity type and having sufficiently low doping of said second conductivity type to behave intrinsically at the operating temperature in an unbiased condition and forming a first junction with said first region, said second region having a majority carrier and a minority carrier; and a third semiconductor region of said second conductivity type sufficiently heavily doped to produce extrinsic behavior at the operating temperature in an unbiased condition and forming a second junction with said second semiconductor region spaced from the first junction, wherein under a predetermined reverse bias, the first junction between the first and second regions extracts said minority carriers from said second region, and said second junction between said second and third regions excludes minority carriers from entering said second region, at least one of said first and said second junctions including a barrier that blocks carriers of one of said first and second conductivity type from entering said active region while permitting flow of carriers of the other of said first and second conductivity type, wherein said barrier does not rely on the diffusion length of said carriers to block said carriers.

27. A photosensitive diode, comprising:

an active region defining a majority carrier of a first conductivity type and a minority carrier of a second conductivity type;

at least one extraction region disposed on a first side of said active region, said extraction region extracting said minority carriers from said active region and having majority carriers within said extraction region flowing toward said active region in a condition of reverse bias;

at least one exclusion region disposed on a second side of said active region, said exclusion region having said minority carriers within said exclusion region flowing toward said active region and receiving said majority carriers from said active region in a condition of reverse bias, at least one of said extraction and said exclusion regions providing a potential barrier for substantially reducing flow of one said of majority carriers and said minority carriers that is flowing toward said active region while permitting flow of the other of said minority carriers and said majority carriers out of said active region, said potential barrier being one selected from the group consisting of an abrupt junction barrier and a graded junction barrier, and at least two biasing contacts for applying said reverse bias through said photodiode and enabling a flow of said carriers through said diode, one of said contacts being coupled to said exclusion region and the other of said contacts being coupled to said extraction region.

28. A photosensitive diode which under a reverse bias defines a direction of current flow through said diode, said diode having a conduction energy band profile and a valence energy band profile generally extending along a direction parallel to said direction of current flow, said diode comprising:

an active region defining a majority carrier of a first conductivity type and a minority carrier of a second conductivity type;

at least one extraction region disposed on a first side of said active region, said extraction region extracting said minority carriers from said active region and having majority carriers within said extraction region flowing toward said active region in a condition of reverse bias;

at least one exclusion region disposed on a second side of said active region, said exclusion region having said minority carriers within said exclusion region flowing toward said active region and receiving said majority carriers from said active region in a condition of reverse bias, at least one barrier region disposed between said active region and one of said extraction and said exclusion regions, said barrier region providing a barrier for substantially reducing flow of one said of majority carriers and said minority carriers that is flowing toward said active region while permitting flow of the other said minority carriers and said majority carriers out of said active region, said barrier region including a flat-top peak on one of said energy band profiles for reducing flow of said one carriers, and at least two biasing contacts for applying said reverse bias through said photodiode and enabling a flow of said carriers through said diode, one of said contacts being coupled to said exclusion region and the other of said contacts being coupled to said extraction region.

29. The diode of claim 28, wherein said diode is formed of a compound semiconductor including mercury, cadmium and tellurium, said flat peak being at least 0.5 µm long along said one of said energy band profiles.

30. The diode of claim 28, wherein the diode is formed of a compound semiconductor including mercury, cadmium and tellurium, an energy gap between said conduction band and said valence band at said flat peak being at least 0.04 eV wider than the energy gap generally defined by said exclusion or said extraction region that is adjacent said barrier region.

31. The diode of claim 28, wherein said diode is formed of a compound semiconductor including mercury, cadmium and tellurium, said barrier region being an exclusion barrier region disposed between said active region and said exclusion region, said barrier region having a larger concentration of dopant and Cd than a concentration of dopant and Cd in said exclusion region.

32. The diode of claim 28, wherein said diode is formed of a compound semiconductor including mercury, cadmium and tellurium, said barrier region being an extraction barrier region disposed between said active region and said extraction region, said barrier region having a larger concentration of dopant and Cd than the concentrations of dopant and Cd in said extraction region.

33. The diode of claim 28, wherein the diode is formed of a compound semiconductor including cadmium, said barrier region being an exclusion barrier region disposed between said active region and said exclusion region, and the diode further comprising an extraction barrier region disposed between said active region and said extraction region, a second barrier region disposed between the active region and said extraction region, a second barrier region having a dopant concentration and Cd concentration respectively greater than the concentrations of dopant and Cd in said exclusion and said extraction regions.

34. A photosensitive diode formed from a compound semiconductor, comprising:

an active region defining a majority carrier of a first conductivity type and a minority carrier of a second conductivity type;

at least one extraction region disposed on a first side of said active region, said extraction region extracting said minority carriers from said active region and having majority carriers within said extraction region flowing toward said active region in a condition of reverse bias, a length of the extraction region defined to be generally parallel to a direction of said flow of said carriers;

at least one exclusion region disposed on a second side of said active region, said exclusion region inhibiting the flow of said minority carriers within said exclusion region toward said active region and receiving said majority carriers from said active region in a condition of reverse bias, a length of said exclusion region being generally parallel to a direction of flow of said carriers, at least one of said extraction and said exclusion regions including a graded composition barrier along at least a portion of the length of said at least one region for substantially reducing flow of one said of majority carriers and said minority carriers that is flowing toward said active region while permitting flow of the other said minority carriers or said majority carriers out of said active region; and first and second biasing contacts for applying said reverse bias through said photodiode and enabling a flow of said carriers through said diode, the first contact being coupled to said exclusion region and the second contact being coupled to said extraction region.

35. The diode of claim 34, wherein said grading is provided along an entire length of said at least one region.

36. The diode of claim 34, wherein all of said extraction and exclusion regions are graded along their lengths.

37. The diode of claim 34, wherein said graded region is made of $Hg_{(1-x)}Cd_xTe$, $0.18<x<0.4$, and said grading is accomplished by varying x.

38. The diode of claim 37, wherein x varies inside of the graded region from about 0.22 µm to about 0.25 µm.

* * * * *